United States Patent
Kinyua

(10) Patent No.: US 9,166,615 B2
(45) Date of Patent: Oct. 20, 2015

(54) SYSTEM AND METHOD FOR CASCADED PWM DIGITAL-TO-ANALOG CONVERTER WITH HYBRID DAC INTERFACE

(71) Applicant: Taiwan Semiconductor Manufacturing Co., Ltd., Hsin-Chu (TW)

(72) Inventor: Martin Kinyua, Cedar Park, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 4 days.

(21) Appl. No.: 14/105,215

(22) Filed: Dec. 13, 2013

(65) Prior Publication Data

US 2015/0171886 A1    Jun. 18, 2015

(51) Int. Cl.
*H03M 1/66* (2006.01)
*H04L 25/03* (2006.01)
*H03M 1/74* (2006.01)

(52) U.S. Cl.
CPC ............. *H03M 1/661* (2013.01); *H03M 1/747* (2013.01); *H04L 25/03261* (2013.01); *H04L 2025/03363* (2013.01)

(58) Field of Classification Search
None
See application file for complete search history.

(56) References Cited

U.S. PATENT DOCUMENTS

| | | | | |
|---|---|---|---|---|
| 6,965,335 B1* | 11/2005 | Trotter et al. | .................. | 341/152 |
| 2010/0265112 A1* | 10/2010 | Ek et al. | .................. | 341/144 |
| 2012/0183092 A1* | 7/2012 | Pelekhaty et al. | ............. | 375/285 |

OTHER PUBLICATIONS

Nguyen, K. et al., "A 108 dB SNR, 1.1 mW Oversampling Audio DAC With a Three-level DEM Technique", IEEE Journal of Solid State Circuits, Dec. 2008, 43(12):2592-2600.

Rueger, T. et al., "A 110dB Ternary PWM Current-Mode Audio DAC with Monolithic 2Vrms Driver" 2004 IEEE International Solid-State Circuits Conference, ISSCC 2004/Session 20/Digital-To-Analog Converters/20.7, Feb. 2004, 10 pages.

Van Tuijl, E. et al., "A 128fs, Multi-Bit ΣΔ CMOS Audio DAC with Real-Time DEM and 115dB SFDR", 2004 IEEE International Solid-State Circuits Conference, ISCC 2004/Session 20/Digital-To-Analog Converters/20.5, Feb. 2004, 8 pages.

* cited by examiner

*Primary Examiner* — Leon-Viet Nguyen
(74) *Attorney, Agent, or Firm* — Duane Morris LLP

(57) ABSTRACT

A system and method is disclosed for a digital to analog converter which includes an interpolation filter to up-sample a digital signal, a cascaded digital pulse width modulation noise shaper having multiple stages to suppress in-band quantization errors due to digital pulse width modulation and truncation errors, and a hybrid finite impulse response filter/ digital to analog converter coupled to a reconstruction filter which outputs the analog signal. The cascaded noise shaper stages each operate using the same quantization error signal.

26 Claims, 7 Drawing Sheets

SYSTEM AND METHOD FOR CASCADED PWM DIGITAL-TO-ANALOG CONVERTER WITH HYBRID DAC INTERFACE

BACKGROUND

Many electrical circuits operate on digital data since there are known advantages to using digital circuit devices. However, some applications require that the output of the digital circuits be converted to the analog domain so that the output can be perceived more easily by humans as well as other entities that are more adapted to receiving and interpreting analog signals than digital signals. Thus, there remains a need to convert digital data into an analog output, for example for audio devices, video devices, and other devices for which an analog signal is advantageous.

The efficient and accurate conversion of digital signals to analog signals, especially at high data rates, continues to be prone to a number of problems, such as performance degradation due to unmatched rise/fall times of the output analog signal, clock jitter limitations, intersymbol interference, and relatively high harmonic distortion, to name a few. Additionally, current digital-to-analog ("DAC") converters sometimes employ multi-bit truncation DACs, which require Dynamic Element Matching schemes to suppress static nonlinearity conversion errors.

Traditionally, a DAC can be implemented in either discrete time or in continuous time, each with its own drawbacks. For example, discrete time implementations, which typically employ switched capacitors, have a dynamic range that is limited by thermal noise, require a large bandwidth for the reconstruction amplifier/low pass filter, and typically require more area in a circuit due to the need for large charge transfer capacitors. Continuous time implementations, which typically employ current steering circuitry, generate distortion and in-band noise due to the unmatched rise/fall times and intersymbol interference, and are very sensitive to clock jitter.

Thus, there is a need for an efficient and accurate DAC that can overcome these and other problems with current DACs.

DETAILED DESCRIPTION

With reference to the figures where like elements have been given like numerical designations to facilitate an understanding of the present subject matter, various embodiments of a system and method for compensating for timing misalignments are described. In order to more fully understand the present subject matter, a brief description of applicable circuitry will be helpful.

A system and method is disclosed for a digital to analog converter which includes an interpolation filter to up-sample a digital signal, a cascaded noise shaping modulator to suppress in-band quantization errors due to digital pulse width modulation and truncation errors, and a hybrid finite impulse response filter/digital to analog converter coupled to a reconstruction filter which outputs the analog signal.

Figure 1:
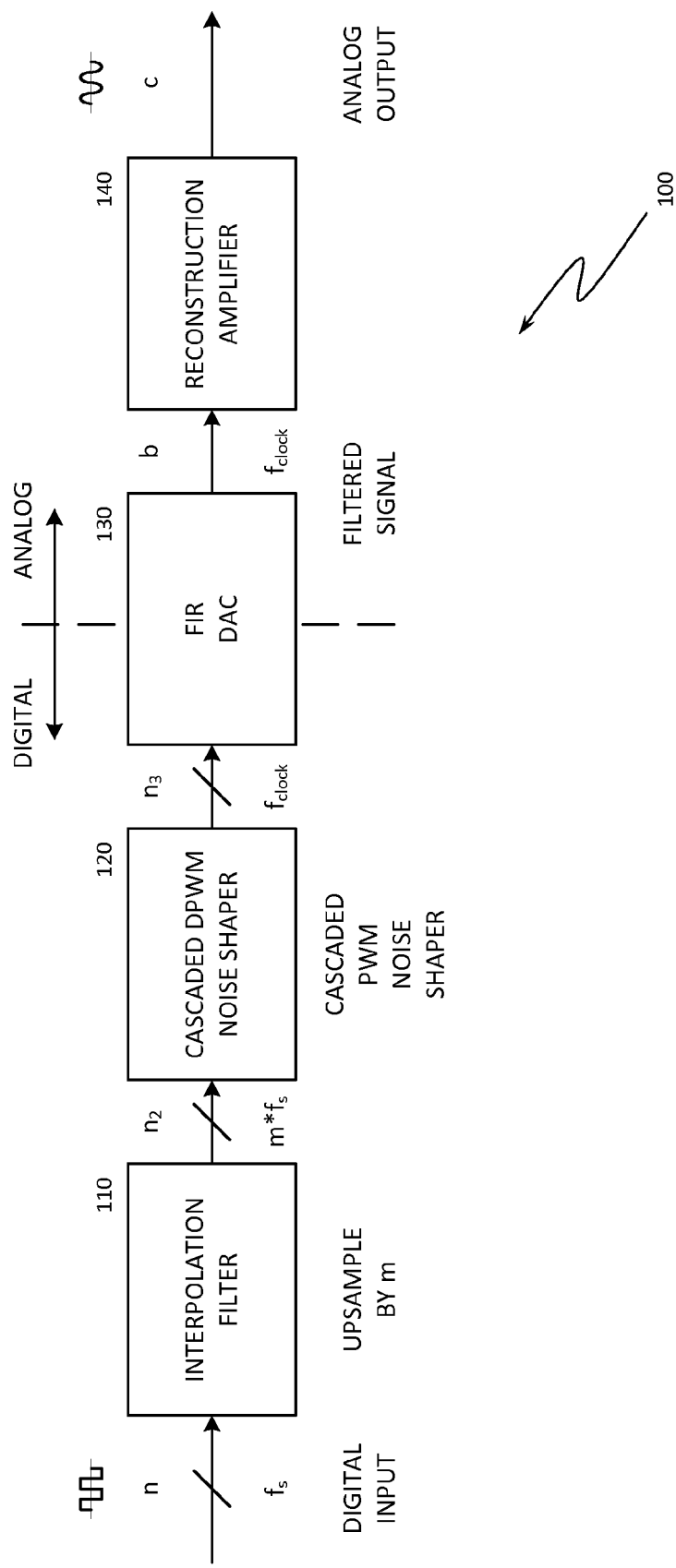
FIG. 1 is an illustration of a high-level functional block diagram of a digital to analog converter ("DAC") circuit containing a cascaded Digital Pulse Width Modulation ("DPWM") Noise Shaper, according to an embodiment of the present subject matter.

Referring to FIG. 1, a high-level functional block diagram 100 of a digital to analog converter circuit according to an embodiment of the present subject matter is illustrated. An input digital signal "n" is input to the interpolation filter 110. In certain embodiments, the digital signal n is a digital audio signal which may be comprised of any standard number of bits (e.g., 16, 20, or 24 bits) having been formed from an analog signal at a particular sampling known sampling rate "$f_s$", as is known in the art. In certain embodiments, the sampling rate is selected to be 48, 96, or 192 kHz, although the scope of the present subject matter contemplates many other sampling rates as are known in the art. For example, the present subject matter contemplates sampling rates in the range of 16-400 kHz. Furthermore, in certain embodiments the digital signal n is a pulse code modulation ("PCM") digital signal.

The interpolation filter 110 upsamples the digital signal n by a predetermined amount "m" where the upsample factor m is typically, but not limited to, a value in the range of 64-1024. Other values for m are contemplated by the present subject matter, such as a value in the range of 32-2048. Thus, the output digital signal from the interpolation filter is digital signal "$n_2$" at a rate of $m*f_s$, as shown. The digital signal $n_2$ is passed to the cascaded Digital Pulse Width Modulation ("DPWM") Noise Shaper 120. The cascaded noise shaper 120 filters out most of the conversion noise, e.g., truncation and pulse width modulation ("PWM") quantization errors, out of the band of interest. In certain embodiments, for example when the digital input signal is a digital audio signal, the band of interest is the audio band (nominally 20 Hz to 20 kHz, as is known in the art). The cascaded noise shaper 120, as described in more detail with respect to FIGS. 2 and 3, alters the spectral shape of error introduced by, for example, truncation and quantization so that the noise power is lower in the band of interest and higher outside the band of interest. For example, the noise power may be spread into a band defined by $m*f_s$. The cascaded noise shaper 120 outputs a plurality of 1-bit PWM digital signals $n_3$ at $f_{clock}$, as shown in FIG. 1.

The digital signal $n_3$ is input into the Finite Impulse Response ("FIR") digital-to-analog converter ("DAC") block 130, also identified as "FIR DAC". As discussed below in more detail with respect to FIGS. 4, 5, and 6, the FIR DAC 130 converts the 1-bit PWM digital signals $n_3$ into multi-level low pass analog signal b which, in certain embodiments, is a filtered audio signal. The analog signal b is input into the reconstruction amplifier 140 which operates on the analog signal b, as discussed below with respect to FIGS. 4, 5, and 6 and outputs the analog output signal c, which is shown in FIG. 1.

Figure 2:
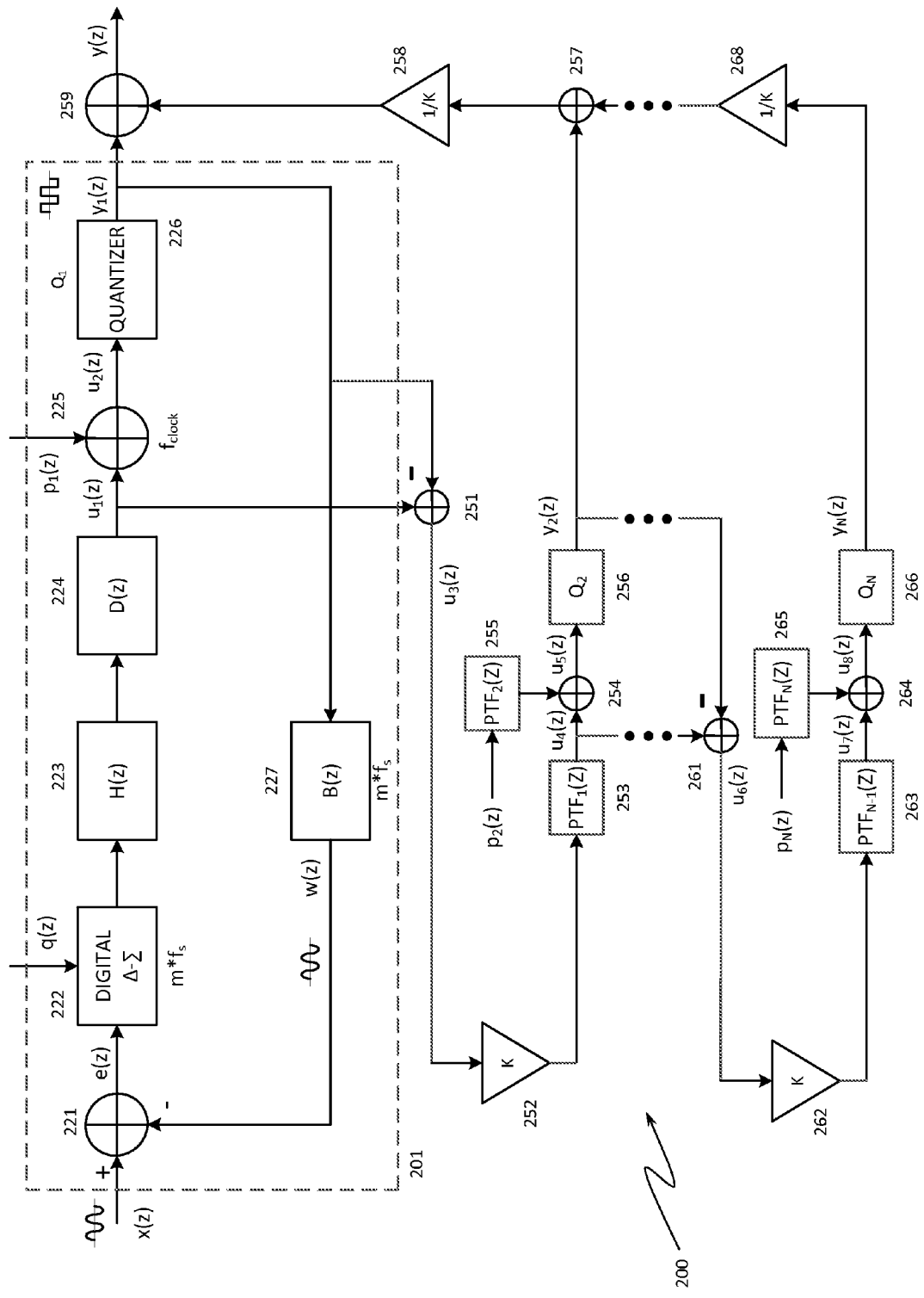
FIG. 2 is an illustration of a functional block diagram of the cascaded DPWM Noise Shaper in FIG. 1, according to an embodiment of the present subject matter.

With attention now directed towards FIG. 2, an illustration of a functional block diagram 200 of the cascaded Digital Pulse Width Modulation ("DPWM") Noise Shaper in FIG. 1 is presented, according to an embodiment of the present subject matter. In the first stage 201, input signal x(z), which corresponds to signal $n_2$ in FIG. 1 at rate $m*f_s$, is input to summing junction 221. In certain embodiments, input signal x(z) is a digital PCM signal. Also input into summing junction 221 is feedback signal w(z), which will be discussed below. The output of summing junction 221 is an error signal e(z) which is applied to the digital Δ-Σ block 222 which is a noise shaping truncator. Also input to the digital Δ-Σ block 222 is digital truncation error signal q(z) which represents the digital truncation error introduced due to rounding/truncating operations of a digital signal as is known in the art. The digital Δ-Σ block 222 operates at rate $m*f_s$. The output of digital Δ-Σ block 222 is applied to loop filter 223, the output of which is then applied to digital compensation filter 224. The digital compensation filter 224 operates to improve the phase margin of the loop, as is known in the art.

The output of the digital compensation filter 224, $u_1(z)$, is applied to summing junction 225. First stage DPWM quantization error signal $p_1(z)$ is also applied to summing junction 225. Summing junction 225 operates at rate $f_{clock}$, which is a higher rate than $m*f_s$, and represents a digital pulse width modulation operation which encodes the output of digital compensation filter 224 into a pulse width modulated signal $u_2(z)$. The PWM signal $u_2(z)$ has a frequency of $f_{PWM}$. The PWM signal $u_2(z)$ is input into quantizer 226, which operates at $f_{clock}$. The quantizer 226 performs a many-to-few mapping, as is known in the art. The output of quantizer 226 is a 1-bit PWM digital signal $y_1(z)$. Digital signal $y_1(z)$ is also fed back through digital low pass filter 227 which performs anti aliasing filtering and samples $y_1(z)$ back to $m*f_s$ (where $m*f_s < f_{clock}$) to thereby produce feedback signal w(z). Feedback signal w(z) is typically a multilevel digital signal.

The output of the digital compensation filter 224, $u_1(z)$, is also applied to summing junction 251. The inverse of digital signal $y_1(z)$ is also applied to summing junction 251. The output of summing junction 251, $u_3(z)$, is a signal which represents the difference between the $u_1(z)$ and $y_1(z)$ signals. The output of the summing junction 251 is applied to digital multiplier circuit 252 which applies an inter-stage gain of k, where k is a known, predetermined, positive value which will be discussed in more detail below. The output of digital multiplier circuit 252 is applied to filter 253 which applies a first stage DPWM signal transfer function $PTF_1(z)$. The output of filter 253, $u_4(z)$, is applied to summing junction 254.

Second stage DPWM quantization error signal $p_2(z)$ is also applied to summing junction 254 after passing through filter 255 which applies a second stage DPWM noise transfer function $PTF_2(z)$. Summing junction 254 operates at rate $f_{clock}$, which is a higher rate than $m*f_s$, and represents a digital pulse width modulation operation which encodes the output of filter 253 into a pulse width modulated second stage signal $u_5(z)$ which has a frequency of $f_{PWM}$. The second stage signal $u_5(z)$ is input into quantizer 256, which operates at $f_{clock}$. The quantizer 256 performs a many-to-few mapping, as is known in the art. The output of quantizer 256 is a 1-bit PWM digital second stage error signal $y_2(z)$.

Embodiments of the present disclosure contemplate any number of stages for the cascaded DPWM noise shaper filter. In an embodiment, the structure of each of the second through $n^{th}$ cascaded stages are the same. In FIG. 2, second through $n^{th}$ cascaded stages are shown. The output of filter 253, $u_4(z)$, is also applied to summing junction 261. The inverse of second stage error signal $y_2(z)$ is also applied to summing junction 261. The output of summing junction 261, $u_6(z)$, is a signal which represents the difference between the $u_4(z)$ and $y_2(z)$ signals. The output of the summing junction 261 is applied to the next stage. In an embodiment, the output of the summing junction 261 is applied to digital multiplier circuit 262 which applies an inter-stage gain of k, where k is a known, predetermined, positive value as discussed above. The output of digital multiplier circuit 262 is applied to filter 263 which applies an n−1 stage DPWM transfer function $PTF_{n-1}(z)$. The output of filter 263, $u_7(z)$, is applied to summing junction 264.

An $n^{th}$ stage DPWM quantization error signal $p_n(z)$ is also applied to summing junction 264 after passing through filter 265 which applies an $n^{th}$ stage DPWM noise transfer function $PTF_n(z)$. Summing junction 264 operates at rate $f_{clock}$, which is a higher rate than $m*f_s$, and represents a digital pulse width modulation operation which encodes the output of filter 263 into a pulse width modulated $n^{th}$ stage signal $u_8(z)$ which has a frequency of $f_{PWM}$. The $n^{th}$ stage signal $u_8(z)$ is input into quantizer 266, which operates at $f_{clock}$. The quantizer 266 performs a many-to-few mapping, as is known in the art. The output of quantizer 266 is a 1-bit PWM digital $n^{th}$ stage error signal $y_n(z)$.

The second stage error signal $y_2(z)$ is applied to summing junction 257. The next higher stage error signal, which, in an embodiment is $n^{th}$ stage error signal $y_n(z)$, is applied to circuit 268 which applies an inter-stage gain of 1/k, where k is a known, predetermined, positive value as discussed above. The output of circuit 268 is also applied to summing junction 257. The output of summing junction 257 is applied to circuit 258 which applies an inter-stage gain of 1/k, where k is a known, predetermined, positive value as discussed above. The output of circuit 258 is applied to summing junction 259.

The output of quantizer 226, $y_1(z)$, is also supplied to summing junction 259. The output of summing junction 259 is a 1-bit PWM digital signal y(z) which is an internal intermediary signal in FIR DAC 130 in FIG. 1. The signals $y_1(z)$ through $y_n(z)$ are components of the signal $n_3$ in FIG. 1.

Figure 3:
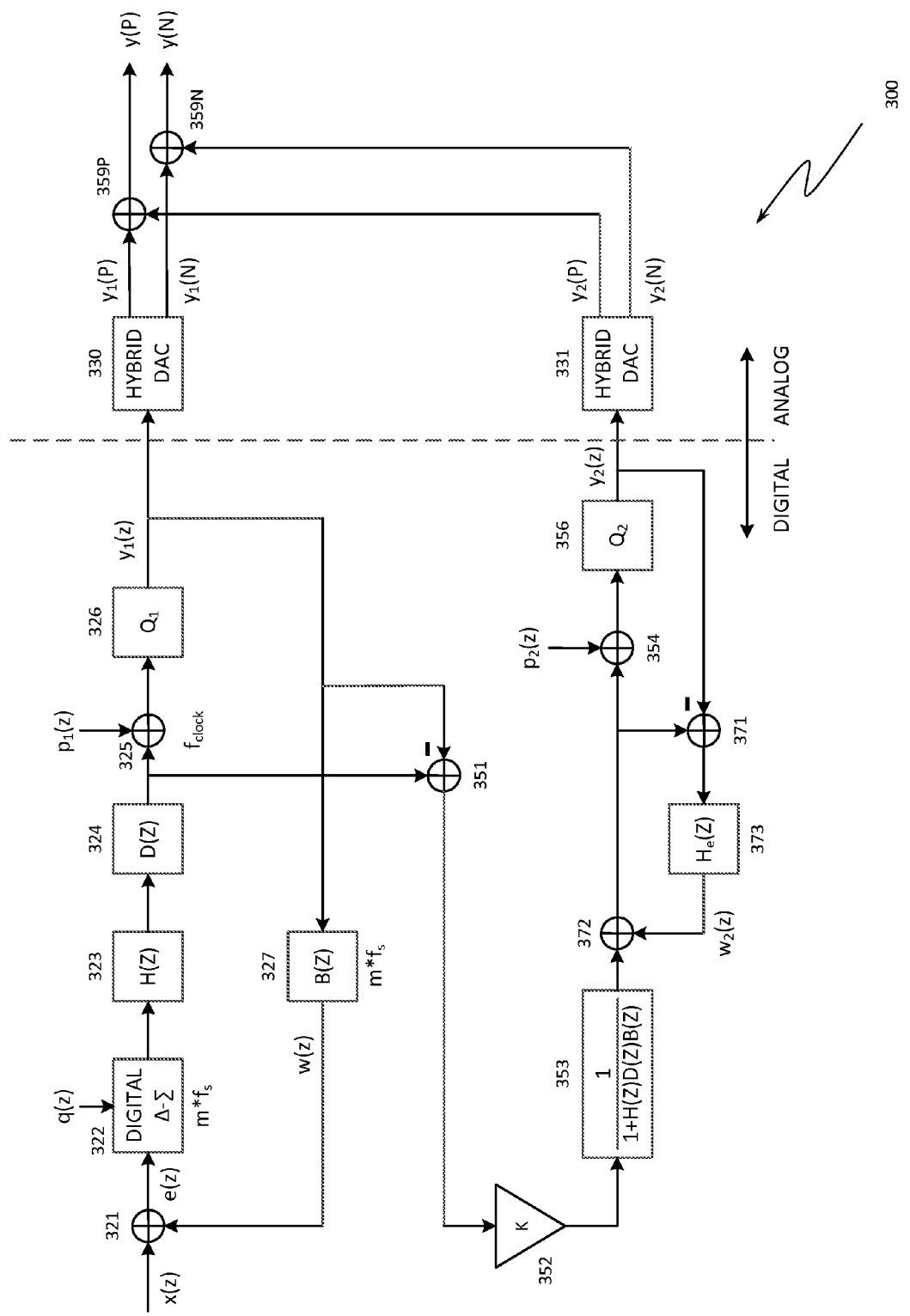
FIG. 3 is an illustration of a functional block diagram showing a loop analysis of a two stage cascaded DPWM Noise Shaper in FIG. 2, according to an embodiment of the present subject matter.

Considering FIG. 3, functional block diagram 300, which is a z-domain linear model, is shown which illustrates a loop analysis of a two stage cascaded DPWM Noise Shaper in FIG. 2, according to a non-limiting embodiment of the present subject matter. Those of skill in the art will readily understand that other cascaded noise shapers with more than two stages are contemplated by the present disclosure. Summing junction 321, which corresponds to summing junction 221 in FIG. 2, combines input signal x(z) and feedback signal w(z) to create error signal e(z) which is input into the noise shaping truncator 322 (which corresponds to the digital Δ-Σ block 222 in FIG. 2). The noise shaping truncator 322 also receives digital truncation error signal q(z), as described above in FIG. 2. In a non-limiting embodiment, the noise shaping truncator 322 operates on the error signals e(z) and q(z) according to the formula:

$$e(z)+q(z)*(1-z^{-1})^N \qquad \text{(Eqn. 1)}$$

where: N is the order of the noise transfer function

The output of the noise shaping truncator 322 is input to the loop filter 323, which corresponds to the loop filter 223 in FIG. 2. In a non-limiting embodiment, loop filter 323 operates on its input signal according to the formula:

$$H(z) = \frac{1}{1-z^{-1}} * G_1 \quad \text{(Eqn. 2)}$$

where: $G_1$ is a DC gain value

The output of loop filter 323 is input to compensation filter 324, which corresponds to digital compensation filter 224 in FIG. 2. In an embodiment, compensation filter 324 operates on its input signal according to the formula:

$$D(z) = \frac{z-a}{(z-b)(z-c)} * G_2 \quad \text{(Eqn. 3)}$$

where:

$G_2$ is a DC gain value a, b, and c are constants

The values of a, b, and c are chosen so that a represents a filter zero frequency location, and b and c represent filter pole frequency locations.

The output of compensation filter 324 is input to summing junction 325, which corresponds to summing junction 225 in FIG. 2. From a linearized signal processing point of view, DPWM quantization error signal $p_1(z)$ is also applied to summing junction 325. The output of summing junction 325 is applied to quantizer $Q_1$ 326 which outputs first stage output signal $y_1(z)$.

The output signal $y_1(z)$ is fed back through the digital low pass filter 327, which corresponds to digital low pass filter 227 in FIG. 2. In a non-limiting embodiment, digital low pass filter 327 operates on its input signal, $y_1(z)$, according to the formula:

$$B(z) = \frac{1}{z-d} * G_3 \quad \text{(Eqn. 4)}$$

where:

$G_3$ is a DC gain value d is a constant

The value of d, is chosen in such a manner that low pass filtering of undesired signal frequencies is performed according to the applicable design specifications for the circuit. As a non-limiting example, the value of d may be chosen such that signals in the audible range (e.g., up to 20 kHz) are passed and signals beyond 20 kHz are suppressed. The output of the digital low pass filter 327 is the feedback signal w(z) that is applied to the summing junction 321 as discussed above.

The output of compensation filter 324 and the output signal $y_1(z)$ are each applied to summing junction 351, where signal $y_1(z)$ is inverted. Summing junction 351 corresponds to summing junction 251 in FIG. 2. The output of summing junction 351 is applied to digital multiplier circuit 352, which corresponds to digital multiplier circuit 252 in FIG. 2. Digital multiplier circuit 352 applies an inter-stage gain of k, where k is a known, predetermined, positive value as discussed in further detail below. The output of digital multiplier circuit 352 is applied to filter 353 which corresponds to filter 253 in FIG. 2. In a non-limiting embodiment, transfer function $PTF_1(z)$ operates on the output signal of digital multiplier circuit 352 according to the formula:

$$PTF_1(z) = \frac{1}{1 + H(z)D(z)B(z)} \quad \text{(Eqn. 5)}$$

The output of filter 353 is applied to summing junction 372. Second stage feedback signal $w_2(z)$ is also applied to summing junction 372. The output of summing junction 372 is applied to summing junction 354. Second stage DPWM quantization error signal $p_2(z)$ is also applied to summing junction 354. The output of summing junction 354 is applied to quantizer $Q_2$ 356 which outputs second stage output signal $y_2(z)$.

The input signal to summing junction 354 and the output signal $y_2(z)$ are each applied to summing junction 371, where the signal $y_2(z)$ is inverted. The output of summing junction 371 is applied to second stage feedback filter 373 which, in a non-limiting embodiment, operates on its input signal according to the formula:

$$H_e(z) = z^{-1}(2-z^{-1}) \quad \text{(Eqn. 6)}$$

The output of second stage feedback filter 373 is second stage feedback signal $w_2(z)$ which is applied to summing junction 372 as discussed above.

The output signal $y_1(z)$ is also applied to hybrid DAC 330 which outputs signals $y_1(P)$ and $y_1(N)$. Likewise, second stage output signal $y_2(z)$ is applied to hybrid DAC 331 which outputs signals $y_2(P)$ and $y_2(N)$. Signals $y_1(P)$ and $y_2(P)$ are applied to summing junction 359P which outputs signal y(P). Likewise, signals $y_1(N)$ and $y_2(N)$ are applied to summing junction 359N which outputs signal y(N). Signals y(P) and y(N) together form signal b (shown in FIG. 1 as the differential output of FIR DAC block 130) according to the following equation:

$$b = y(P) - y(N)$$

Thus, the analysis of one non-limiting embodiment of the z-domain linear model 300 results in the following equation:

$$y(z) = \frac{H(z)D(z)}{1+H(z)D(z)B(z)}x(z) + \frac{H(z)D(z)}{1+H(z)D(z)B(z)}q(z) + \frac{p_2(z)(1-H_e(z))}{k} \quad \text{(Eqn. 7)}$$

where: $PTF_2(z) = (1 - H_e(z))$; in this particular embodiment

In certain embodiments, a designer of the system represented by FIG. 3 may choose the value of $H_e(z)$ such that the $PTF_2(z)$ term is a squared term. For an embodiment where Equation 6 holds true, i.e.:

$$H_e(z) = z^{-1}(2-z^{-1})$$

Equation 7 becomes:

$$y(z) = \frac{H(z)D(z)}{1+H(z)D(z)B(z)}x(z) + \frac{H(z)D(z)}{1+H(z)D(z)B(z)}q(z) + \frac{p_2(z)(1-z^{-1})^2}{k} \quad \text{(Eqn. 8)}$$

For a generalized system where there are n cascaded stages:

$$y(z) = y_1(z) + \frac{y_2(z)}{k} + \ldots + \frac{y_n(z)}{k^{n-1}}$$

where:

$$y(z) = \frac{H(z)D(z)x(z)}{1+H(z)D(z)B(z)} + \frac{H(z)D(z)q(z)}{1+H(z)D(z)B(z)} + \frac{p_1(z)}{1+H(z)D(z)B(z)}$$

$$y_2(z) = -k \cdot p_1(z) \cdot PTF_1(z) + p_2(z) \cdot PTF_2(z)$$

where:

$$PTF_1(z) = \frac{1}{1+H(z)D(z)B(z)}$$

$$y_n(z) = -k \cdot p_{n-1}(z) \cdot PTF_n(z) + p_n(z) \cdot PTF_n(z)$$

Substituting in the values of $y_1(z)$, $y_2(z)$, and $y_n(z)$ results in:

$$y(z) = \frac{H(z)D(z)x(z)}{1+H(z)D(z)B(z)} + \frac{H(z)D(z)q(z)}{1+H(z)D(z)B(z)} + \frac{p_n(z) \cdot PTF_n(z)}{k^{n-1}} \quad (\text{Eqn. 9})$$

In an embodiment the term $PTF_n(z)$ can be chosen to be a high pass filter to spectrally "shape" PWM quantization error $p_n(z)$ to high frequency out of an audio band. In an embodiment:

$$PTF_n = \frac{1}{1+H(z)D(z)B(z)}$$

As can be seen from Equation 9, the denominator of the third term, i.e., $k^{n-1}$, has the effect of scaling the third term down: the higher the value of n, the smaller the third term becomes. Thus, the more stages the cascaded noise shaper employs, the smaller the PWM quantization error term (i.e., the third term of Equation 9) becomes.

For the operation of the cascaded DPWM Noise Shaper 120 of FIG. 1, represented by Eqn. 9 above, the input signal should be impacted as little as possible in the band of interest. Therefore, there is a need to oversample the input signal which is accomplished by the use of the interpolation filter 110 to convert the digital input signal n at rate $f_s$ to the digital signal $n_2$ at rate $m*f_s$ (which corresponds to incoming signal $x(z)$ in FIG. 3 and Eqn. 9, above). Analyzing Eqn. 9, the term in the denominator of each of the first two terms on the right-hand side of the equation, $1+H(z)D(z)B(z)$, should ideally be large to diminish error terms. However, if the denominator is too large, the loop will become unstable. Typical values for the denominator term for a high fidelity system may be >100 dB, although other values are contemplated by embodiments of the present subject matter.

Considering now the first term on the right-hand side of Equation 9, this term represents the incoming signal $x(z)$ and therefore is in the band of interest. Ideally, the response of the z-domain linear model 300 to this term is flat. In order to accomplish this, the value of $$\frac{1}{B(z)}$$

should be approximately unity gain, i.e., should act as an all pass filter in the band of interest. Considering now the second and third terms on the right-hand side of Equation 9, these terms represent error signals $q(z)$ and $p(z)$, respectively, and ideally the z-domain linear model 300 will suppress these terms in the band of interest and will shape the power of the error signals $q(z)$ and $p(z)$ such that the power of these signals will appear out of the band of interest. In an embodiment, noise shaping truncator 322 in FIG. 3 may operate on its input signal, $e(z)$, using the formula $(1-z^{-1})^N$. Thus, in the second term of Equation 9, the expression $(1-z^{-1})^N$ from Equation 1 is a differentiator which acts like a high pass filter: it will attenuate low frequencies but will allow high frequencies to pass. In this manner, the frequency spectrum of incoming signals are modified such that low frequency signals are suppressed and moved to higher out-of-band frequency regions. Thus, the values in Equation 9 (i.e., G1, G2, G3, a, b, c, and d, from Equations 2, 3, and 4) are chosen such that for the specific circuitry in which the cascaded DPWM Noise Shaper 120 is used, the filters $H(z)$, $D(z)$, and $B(z)$ in the z-domain linear model 300 operate as described above, i.e., for the suppression of noise in the band of interest.

The above-described apparatus is designed to suppress both truncation errors and DPWM quantization errors by spectrally shaping most of the power associated with these errors out of the band of interest by employing feedback. Additionally, the z-domain linear model 300 shown in FIG. 3 can be easily compensated by the included digital filter $D(z)$ and the loop dynamic response can also be optimized by the digital filter $D(z)$.

Figure 4:
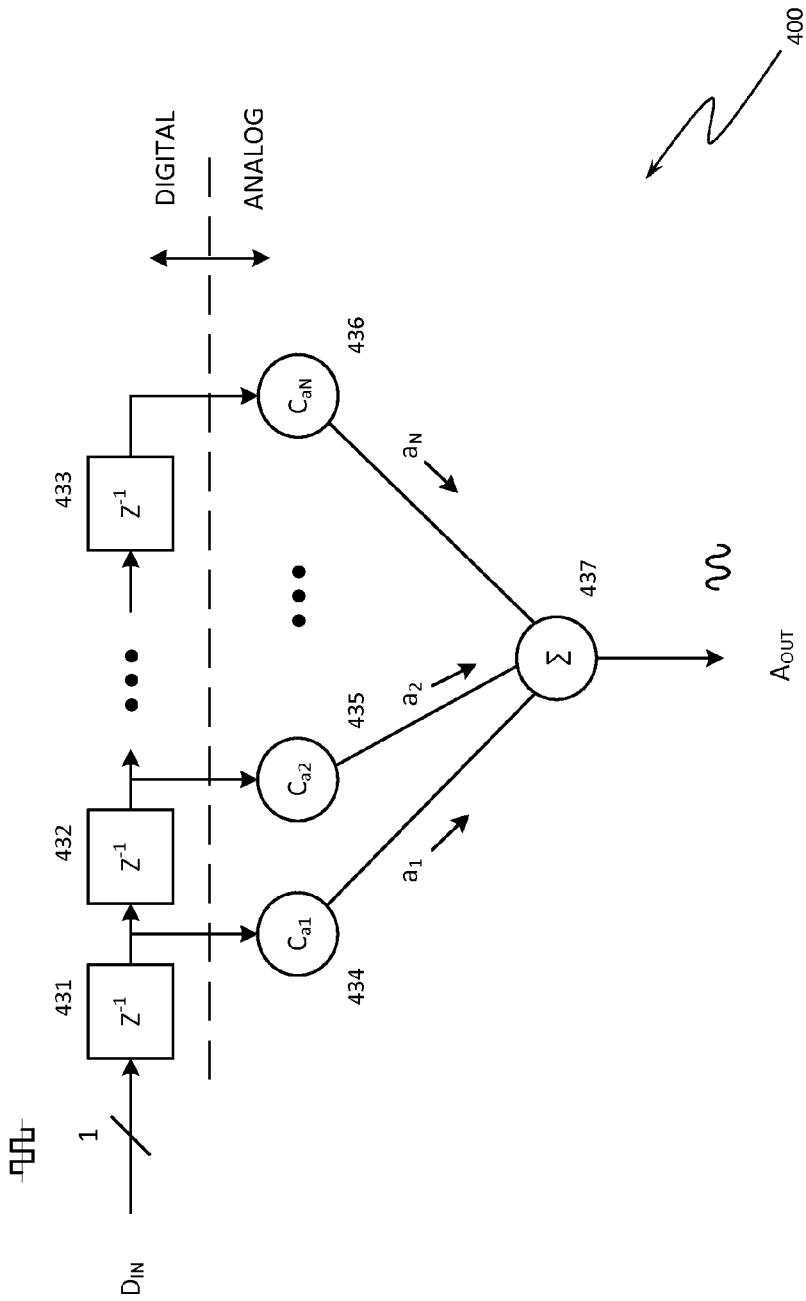
FIG. 4 is an illustration of a functional block diagram for circuitry in the Finite Impulse Response ("FIR") digital-to-analog converter ("DAC") block in FIG. 1, according to an embodiment of the present subject matter.

FIG. 4 is an illustration of a functional block diagram for FIR DAC circuitry 400 which corresponds to a portion of the FIR DAC block 130 in FIG. 1, according to an embodiment of the present subject matter. In an embodiment, the input signal $D_{IN}$ corresponds to the output of quantizer 226 in FIG. 2, which may be 1-bit PWM digital signal $y_1(z)$ at $f_{clock}$. The FIR DAC circuitry 400 in this embodiment is an N-tap FIR filter as shown in FIG. 4 where the filter coefficients $C_{a1}$, $C_{a2}$, ..., $C_{aN}$, (designated 434, 435, through 436, respectively) are analog while the delay elements 431, 432, through 433 are implemented digitally using, for example, a shift register. The filter coefficients $C_{a1}$, $C_{a2}$, ..., $C_{aN}$, are implemented by either current sources or by a charge in a capacitor. Other implementations for the FIR DAC circuitry 400 are contemplated by the present subject matter. For example, FIR DAC circuitry 400 may be implemented in a continuous time manner, for example using current steering, as is known in the art. As a further example, FIR DAC 400 may be implemented in a discrete time manner, for example using switched capacitors, as is known in the art. The analog quantities $a_1$, $a_2$, ..., $a_N$ (current or charge) are summed in summer 437 to form analog output signal $A_{OUT}$.

The transfer function for FIR DAC circuitry 400 is:

$$H(z) = \frac{A_{OUT}}{D_{IN}(z)} = a_1 z^{-1} + a_2 z^{-2} + \ldots + a_N z^{-N} \quad (\text{Eqn. 10})$$

As can be seen from FIG. 4, FIR DAC circuitry 400 converts the single-bit serial input signal $D_{IN}$ into a multi-level parallel continuous-time output signal $A_{OUT}$. One of the advantages of the above-described apparatus is that FIR DAC circuitry 400 is inherently linear since the digital implementation of the delay elements 431, 432, through 433 is linear and any mismatch among the analog coefficient elements 434, 435, through 436 (implemented as either current sources or capacitors) simply degrade the gain stop-band response and phase response. A further advantage of FIR DAC circuitry 400 is that since the input signal $D_{IN}$ is a PWM signal, FIR DAC circuitry 400 is substantially resistant to inter-symbol interference ("ISI").

A still further advantage is that FIR DAC circuitry 400 is controlled by delayed versions of the same input signal, $D_{IN}$. Since $D_{IN}$ is only a 1-bit signal, there are no harmonic distortion errors injected due to a multi-bit input signal. For example, if the input signal $D_{IN}$ were to be a multi-bit PCM (pulse code modulation) signal which, for example, has 8-bit words in parallel, an error in any one of those bits will produce a distortion of the input signal. In a FIR DAC having a PCM input signal, the control signals are comprised of different bit positions of the PCM signal and thus comprise harmonics of the sinusoidal input. Errors thus introduced will cause harmonic distortion which will negatively affect the linearity of the FIR DAC. In order to combat the harmonic distortion errors, a FIR DAC having a PCM (or other multi-bit) input signal will require linearization circuitry, such as Dynamic Element Matching ("DEM") in order to achieve a sufficient level of linearity.

Figure 5:
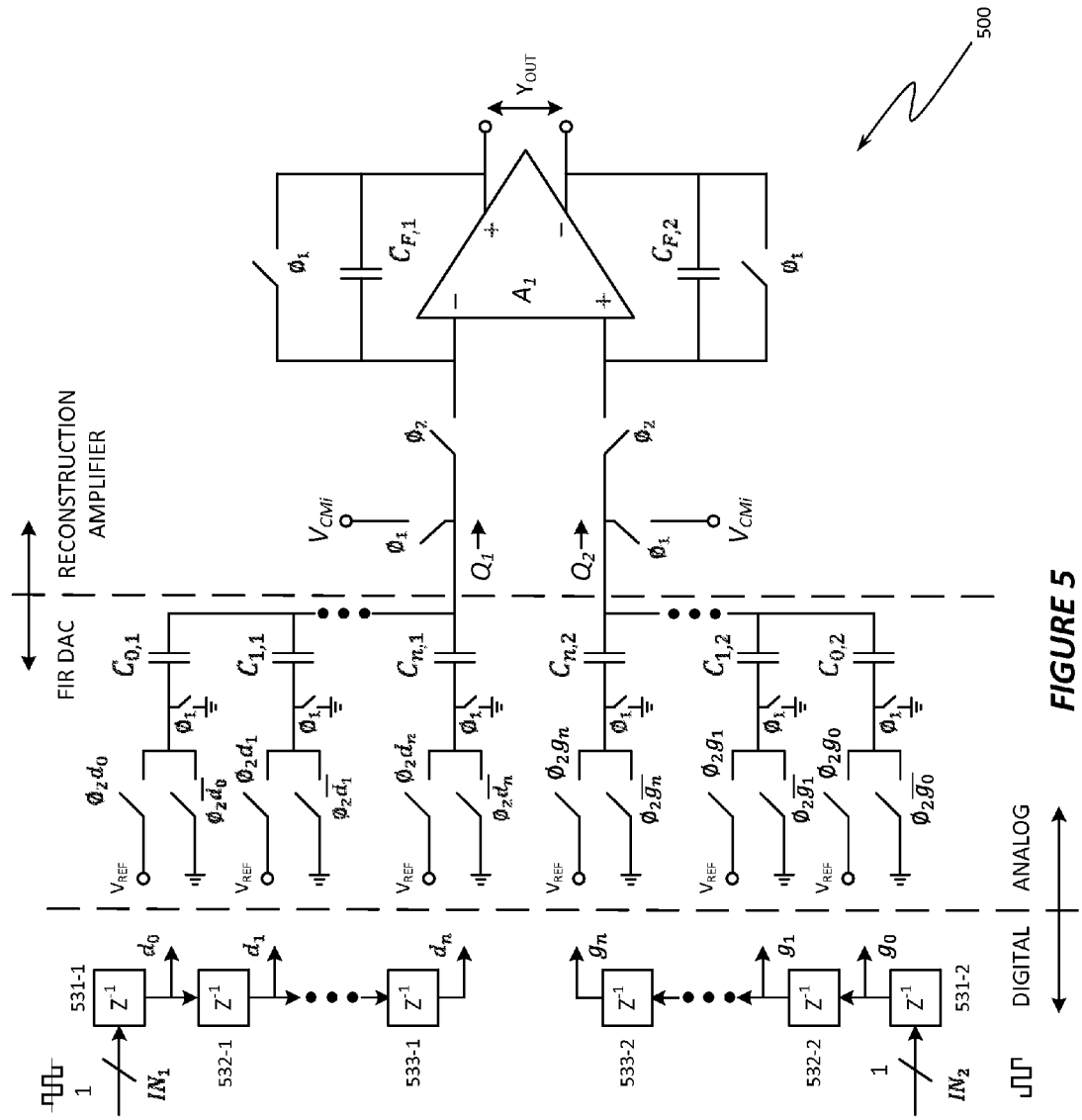
FIG. 5 is an illustration of a functional block diagram for the FIR DAC block combined with the reconstruction amplifier in FIG. 1 showing an implementation using switched capacitors, according to an embodiment of the present subject matter.

Regarding FIG. 5, presented is an illustration of a functional schematic diagram 500 for the hybrid DAC filter and reconstruction amplifier which corresponds to block 130 and block 140 in FIG. 1, according to an embodiment of the present subject matter. In FIG. 5, the input signal $IN_1$ is one of the components of the plurality of signals that make up the signal $n_3$ in FIG. 1, such as the signals $y_1(z)$ through $y_n(z)$, as described above. In an embodiment, the input signal $IN_1$ is the output of quantizer 226, $y_1(z)$, which is a 1-bit PWM digital signal at $f_{clock}$. Additionally, the input signal $IN_2$ is also one of the components of the plurality of signals that make up the signal $n_3$ in FIG. 1, such as the signals $y_1(z)$ through $y_n(z)$, as described above. In an embodiment, the input signal $IN_2$ is the output of quantizer 256, $y_2(z)$, which is a 1-bit PWM digital signal at $f_{clock}$. In FIG. 5, the hybrid DAC filter portion of schematic diagram 500 in this embodiment is an N-tap FIR filter where the filter coefficients are analog while the delay elements 531-1, 532-1, through 533-1 and 531-2, 532-2, through 533-2 are implemented digitally using shift registers. The filter coefficients in FIG. 5 are implemented by the charge in the capacitors $C_{0,1}$, $C_{1,1}$, through $C_{n,1}$ and $C_{0,2}$, $C_{1,2}$, through $C_{n,2}$, respectively, as described below. Other implementations for the FIR DAC in schematic diagram 500 are contemplated by the present subject matter, for example in a continuous time manner or a discrete time manner, as is known in the art.

The hybrid DAC portion of schematic diagram 500 operates in two modes: a reset mode and an information capture mode. In the reset mode, the switches marked $\varnothing_1$ are closed thereby allowing the hybrid DAC to reset. In the information capture mode, the switches marked $\varnothing_2$ are closed to allow information flow through the hybrid DAC. The timings of the $\varnothing_1$ and $\varnothing_2$ switches are taken from clocks operating at $f_{clock}$. The clock triggering the $\varnothing_1$ switches is offset from the clock triggering the $\varnothing_2$ switches so that the $\varnothing_1$ and $\varnothing_2$ switches are not closed at the same time.

In operation, each output of the shift registers controls a set of switches for the associated filter coefficient capacitor. For shift register 531-1, the output signal $d_0$ operates the switches for charging capacitor $C_{0,1}$, i.e., the switches designated $\varnothing_2 d_0$ and $\varnothing_2 \overline{d_0}$. If signal $d_0$ is high, the switch $\varnothing_2 d_0$ is closed thereby connecting capacitor $C_{0,1}$ to $V_{REF}$. If signal $d_0$ is low, the switch $\varnothing_2 \overline{d_0}$ is closed thereby connecting capacitor $C_{0,1}$ to ground. Similarly, for shift register 532-1, the output signal $d_1$ operates the switches for charging capacitor $C_{1,1}$, i.e., the switches designated $\varnothing_2 d_1$ and $\varnothing_2 \overline{d_1}$. If signal $d_1$ is high, the switch $\varnothing_2 d_1$ is closed thereby connecting capacitor $C_{1,1}$ to $V_{REF}$. If signal $d_1$ is low, the switch $\varnothing_2 \overline{d_1}$ is closed thereby connecting capacitor $C_{1,1}$ to ground. Each of the remaining shift registers, up through 533-1, operate in a similar manner. The resulting output from capacitors $C_{0,1}$, $C_{1,1}$, through $C_{n,1}$, designated $Q_1$, is applied to the amplifier $A_1$ as discussed below.

Likewise, the shift registers receiving the $IN_2$ signal operate in a similar manner. For shift register 531-2, the output signal $g_0$ operates the switches for charging capacitor $C_{0,2}$, i.e., the switches designated $\varnothing_2 g_0$ and $\varnothing_2 \overline{g_0}$. If signal $g_0$ is high, the switch $\varnothing_2 g_0$ is closed thereby connecting capacitor $C_{0,2}$ to $V_{REF}$. If signal $g_0$ is low, the switch $\varnothing_2 \overline{g_0}$ is closed thereby connecting capacitor $C_{0,2}$ to ground. Similarly, for shift register 532-2, the output signal $g_1$ operates the switches for charging capacitor $C_{1,2}$, i.e., the switches designated $\varnothing_2 g_1$ and $\varnothing_2 \overline{g_1}$. If signal $g_1$ is high, the switch $\varnothing_2 g_1$ is closed thereby connecting capacitor $C_{1,2}$ to $V_{REF}$. If signal $g_1$ is low, the switch $\varnothing_2 \overline{g_1}$ is closed thereby connecting capacitor $C_{1,2}$ to ground. Each of the remaining shift registers, up through 533-2, operate in a similar manner. The resulting output from capacitors $C_{0,2}$, $C_{1,2}$, through $C_{n,2}$, designated $Q_2$, is applied to the amplifier $A_1$ as discussed below. As can be seen from FIG. 5, during the reset mode (i.e., when the switches marked $\varnothing_1$ are closed) the right hand side plates of the capacitors $C_{0,1}$, $C_{1,1}$, through $C_{n,1}$, and the capacitors $C_{0,2}$, $C_{1,2}$, through $C_{n,2}$ are connected to voltage $V_{CMi}$, which is a common mode voltage that also sets the virtual analog ground for the amplifier $A_1$.

The transfer function for the hybrid DAC in schematic diagram 500 is:

$$H(z) = \frac{Y(z)}{X(z)} = \sum_{i=0}^{n} \frac{C_i}{C_F} z^{-1} \quad \text{(Eqn. 6)}$$

As can be seen from FIG. 5, the hybrid DAC in schematic diagram 500 converts the single-bit serial input signals $IN_1$ and $IN_2$ into multi-level parallel continuous-time output signals $Q_1$ and $Q_2$, respectively. One of the advantages of the above-described apparatus is that the FIR DAC is inherently linear since the digital implementation of the delay elements 531-1, 532-1, through 533-1, and 531-2, 532-2, through 533-2 is linear and any mismatch among the analog coefficient elements $C_{0,1}$, $C_{1,1}$, through $C_{n,1}$ and $C_{0,2}$, $C_{1,2}$, through $C_{n,2}$, (implemented as either current sources or, as shown in schematic diagram 500, as capacitors) simply degrade the gain stop-band response and phase response. A further advantage of the hybrid DAC is that since the input signals $IN_1$ and $IN_2$ are each a PWM signal, the hybrid DAC is resistant to inter-symbol interference ("ISI").

A still further advantage is that each branch of the hybrid DAC in schematic diagram 500 is controlled by delayed versions of the same input signals, signals $IN_1$ and $IN_2$, respectively. Since signals $IN_1$ and $IN_2$ are each only a 1-bit signal, there are no harmonic distortion errors injected due to a multi-bit input signal. For example, if the input signals $IN_1$ and $IN_2$ were to be multi-bit PCM (pulse code modulation) signals which, for example, has 8-bit words in parallel, an error in any one of those bits will produce a distortion of the input signal. In a hybrid DAC having a PCM input signal, the control signals are comprised of different bit positions of the PCM signal and thus comprise harmonics of the sinusoidal input. Errors thus introduced will cause harmonic distortion which will negatively affect the linearity of the hybrid DAC. In order to combat the harmonic distortion errors, a hybrid DAC having a PCM (or other multi-bit) input signal will require linearization circuitry, such as Dynamic Element Matching ("DEM") in order to achieve a sufficient level of linearity.

The reconstruction amplifier portion of the schematic diagram 500 receives the output signals $Q_1$ and $Q_2$ from the hybrid DAC portion of the schematic diagram 500. Signals $Q_1$ and $Q_2$ are applied to amplifier $A_1$ which includes feedback capacitors $C_{F,1}$ and $C_{F,2}$ so that amplifier $A_1$ is an integrator operating as a low pass filter so that the input signals $Q_1$ and $Q_2$ are low-pass filtered to create the analog output signal $Y_{OUT}$.

Figure 6:
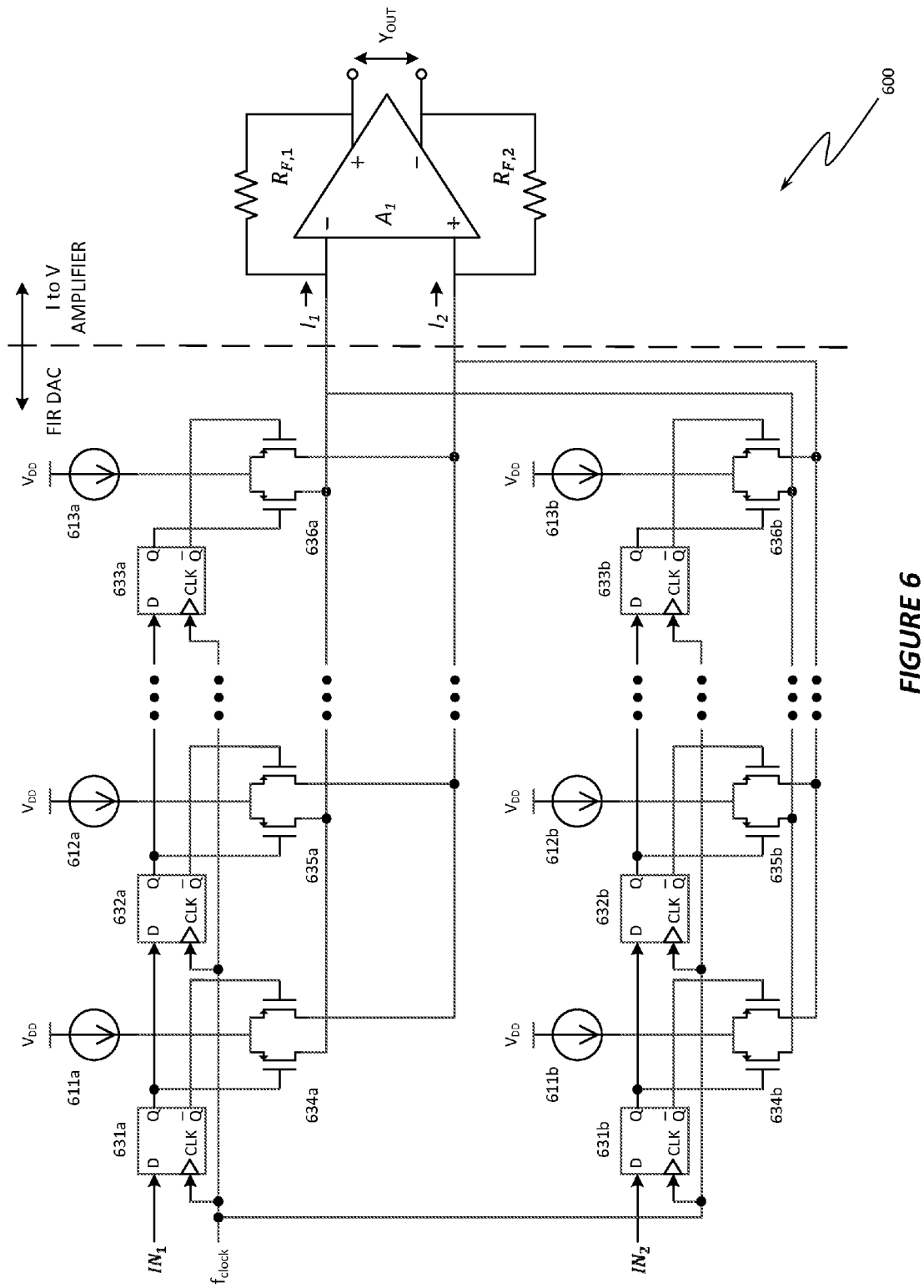
FIG. 6 is an illustration of a functional block diagram for the FIR DAC block combined with the reconstruction amplifier in FIG. 1 showing an implementation using current steering, according to an embodiment of the present subject matter.

Considering FIG. 6, presented is an illustration of a functional schematic diagram 600 for the hybrid DAC filter and reconstruction amplifier which corresponds to block 130 and block 140 in FIG. 1, according to an embodiment of the present subject matter. In the particular non-limiting embodiment illustrated, the hybrid DAC filter is implemented using current steering with D flip-flops, current sources, and transistor sets, as explained in further detail below.

In FIG. 6, the multi-bit input signal represented by $IN_1$ and $IN_2$ is the noise shaper 120 output signal $n_3$, which is a 1-bit PWM digital signal at $f_{clock}$ as shown in FIG. 1. The input signal $IN_1$ is one of the components of the plurality of signals that make up the signal $n_3$ in FIG. 1, such as the signals $y_1(z)$ through $y_n(z)$, as described above. In an embodiment, the input signal $IN_1$ is the output of quantizer 226, $y_1(z)$, which is a 1-bit PWM digital signal $f_{clock}$. Additionally, the input signal $IN_2$ is also one of the components of the plurality of signals that make up the signal $n_3$ in FIG. 1, such as the signals $y_1(z)$ through $y_n(z)$, as described above. In an embodiment, the input signal $IN_2$ is the output of quantizer 256, $y_2(z)$, which is a 1-bit PWM digital signal at $f_{clock}$. In FIG. 6, the hybrid DAC filter portion of schematic diagram 600 in this embodiment is an N-tap FIR filter where the filter coefficients are analog while the delay elements are implemented digitally using D flip-flops 631a, 632a, through 633a and 631b, 632b, through 633b, each clocked at $f_{clock}$. The filter coefficients in FIG. 6 are implemented by the current provided by current sources 611a, 612a, through 613a via transistor pairs 634a, 635a, and 636a, respectively, and 611b, 612b, through 613b via transistor pairs 634b, 635b, and 636b, respectively. Other implementations for the FIR DAC in schematic diagram 600 are contemplated by the present subject matter and the exemplary arrangement of flip-flops and transistors shown is non-limiting, as would be apparent to one of skill in the art.

In operation, the Q and $\overline{Q}$ outputs of D flip-flop 631a, for example, are each attached to a separate gate terminal of the pair of transistors 634a as shown in FIG. 6. The source terminals of the transistors 634a are both operatively connected to the output of current source 611a, the input of which is operatively connected to voltage source $V_{DD}$, as shown. Thus, when input signal $IN_1$ is applied to D flip-flop 631a and the flip-flop is clocked by $f_{clock}$, either the Q or $\overline{Q}$ output of D flip-flop 631a will forward bias its respective transistor (depending on the value of $IN_1$) thereby allowing current from current source 611a to flow to the appropriate input of amplifier $A_1$ shown as current $I_1$ or $I_2$. The other sets of D flip-flop, transistor pair, and current source operate in a similar manner, as is known to those of skill in the art.

The I to V amplifier portion of the schematic diagram 600 receives the output signals $I_1$ and $I_2$ from the hybrid DAC portion of the schematic diagram 600. Signals $I_1$ and $I_2$ are applied to amplifier $A_1$ which includes feedback resistors $R_{F,1}$ and $R_{F,2}$ so that amplifier $A_1$ is acting as a current to voltage converter to create the analog output signal $Y_{OUT}$.

Figure 7:
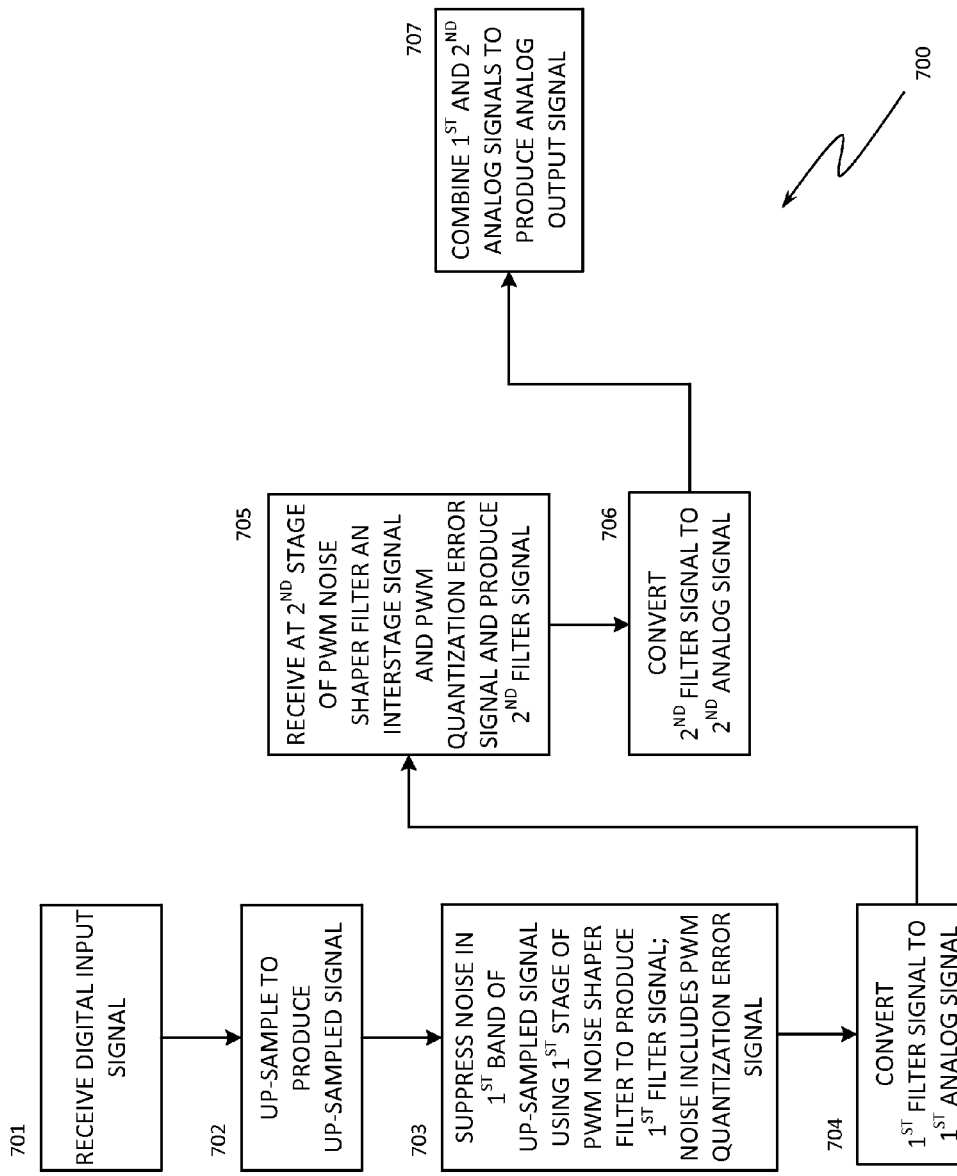
FIG. 7 is a flow chart for a method for digital-to-analog conversion using a two stage cascaded DPWM Noise Shaper, according to an embodiment of the present subject matter.

With attention now drawn to FIG. 7, a flow chart 700 is presented for a method for digital-to-analog conversion according to an embodiment of the present subject matter. At block 701, a digital input signal is received at a first stage of a cascaded pulse width modulation noise shaper filter. The digital input signal spans a first predetermined band. At block 702, the digital input signal is up-sampled to create an up-sampled signal, which is a digital signal. The up-sampled signal spans a second predetermined band which includes the first predetermined band and is wider than the first predetermined band. At block 703, noise in a first band of the up-sampled signal is suppressed. This noise is digital truncation error noise and/or quantization error noise and is suppressed using the first stage of a cascaded pulse width modulation noise shaper filter to thereby produce a first filter signal. At block 704, the first filter signal is converted to a first analog signal using a first digital to analog converter. At block 705, an inter-stage signal from the first stage and the PWM quantization error signal is received at a second stage of the cascaded PWM noise shaper filter and a second filter signal is produced therefrom. At block 706, the second filter signal is converted to a second analog signal using a second digital to analog converter. At block 707, the first and second analog signals are combined to thereby produce an analog output signal.

As discussed above, an embodiment of the present subject matter includes a system for converting a digital signal to an analog signal where the system includes an interpolation filter including an input for receiving a digital input signal, a cascaded pulse width modulated noise shaper filter having a plurality of stages, a first digital to analog converter for receiving an input from a first of the plurality of stages of the noise shaper filter where the first digital to analog converter includes a first finite impulse response filter having N-taps and N tap weights, where N is a predetermined number, and where each of the N-taps is implemented digitally and each of the N tap weights is implemented non-digitally using a first circuit, a second digital to analog converter for receiving an input from a second of the plurality of stages of the noise shaper filter, where the second digital to analog converter includes a second finite impulse response filter having N-taps and N tap weights, where N is a predetermined number, and where each of the N-taps is implemented digitally and each of the N tap weights is implemented non-digitally using a second circuit, a combining circuit for combining an output from the first and second digital to analog converters, and an output for outputting an analog signal from the combining circuit.

In one embodiment, at least one of the first and second circuit is a current steering circuit. In another embodiment, at least one of the first and second circuit is a switched capacitor circuit.

In a further embodiment, the digital input signal spans a first predetermined band, and the interpolation filter up-samples the digital input signal by a predetermined value and outputs a first filter signal which spans a second predetermined band which includes the first predetermined band and is wider than the first predetermined band. In yet a further embodiment, the first noise shaper filter stage receives the first filter signal, suppresses conversion noise in the first predetermined band, and outputs a second filter signal to the first digital to analog converter, wherein the second filter signal spans the second predetermined band. In still a further embodiment, the second noise shaper filter stage receives an input signal from the first noise shaper filter stage and an error signal and produces therefrom the input received by the second digital to analog converter. In a further embodiment, the input signal from the first noise shaper filter stage is scaled by a predetermined number K and the output from the second digital to analog converter is scaled by 1/K.

In another embodiment, the first predetermined band is within an audio signal sampling rate range. In yet another embodiment, the predetermined value by which the interpolation filter up-samples the digital input signal is in the range of 32-2048.

In certain embodiments, the digital input signal is a pulse code modulation signal. In some of these embodiments, the digital input signal is a digital audio signal.

An embodiment of the present subject matter includes a system for converting a digital signal to an analog signal having an interpolation filter which includes an input for receiving the digital signal and an output for outputting an interpolation signal, where the digital signal spans a first predetermined band, and where the interpolation signal spans a second predetermined band which is wider than the first predetermined band and includes the first predetermined band. The system further includes a cascaded pulse width modulation ("PWM") noise shaper filter having a first stage for receiving the interpolation signal and for receiving at least one error signal, where the first stage suppresses errors in the first predetermined band of the interpolation signal and outputs a PWM signal, where the PWM signal is a one-bit code signal, and where the at least one error signal includes a PWM quantization error signal, and a second stage for receiving an input signal from the first stage and receiving the PWM quantization error signal, and for outputting a second stage signal. The system further includes a first digital to analog converter having an input for receiving the PWM signal, a finite impulse response filter having N-taps and N tap weights for converting the PWM signal into a first converted signal where the first converted signal is a multi-level signal, where N is a predetermined number, and where each of the N-taps is implemented digitally and each of the N tap weights is implemented non-digitally using a first circuit, and a first output for outputting the first converted signal. The system further includes a second digital to analog converter having an input for receiving the second stage signal, a finite impulse response filter having N-taps and N tap weights for converting the second stage signal into a second converted signal where the second converted signal is a multi-level signal, where N is a predetermined number, and where each of the N-taps is implemented digitally and each of the N tap weights is implemented non-digitally using a second circuit, and a second output for outputting the second converted signal. The system further includes a combining circuit for combining the first and second converted signals to produce therefrom a combined signal and a reconstruction amplifier having an input for receiving the combined signal, a third circuit for changing the combined signal into an analog signal, and an output for outputting the analog signal.

In a further embodiment, at least one of the first and second circuits is a current steering circuit. In another further embodiment, at least one of the first and second circuits is a switched capacitor circuit.

In other embodiments of the above-described system, the digital input signal is a pulse code modulation signal, where in certain of these embodiments the digital input signal is a digital audio signal.

In still other embodiments of the above-described system, the first predetermined band is in the range of 16-400 kHz. In yet other embodiments, the third circuit includes an integrator which sums the combined signal and performs low pass filtering. In still further embodiments, the input signal received from the first stage is scaled by a predetermined number K and the second converted signal is scaled by 1/K.

A still further embodiment of the present subject matter includes a method for converting a digital input signal to an analog output signal, including receiving a digital input signal which spans a first predetermined band, up-sampling the digital input signal to produce an up-sampled signal which spans a second predetermined band which includes the first predetermined band and is wider than the first predetermined band, suppressing noise in the first predetermined band of the up-sampled signal using a first stage of a cascaded pulse width modulation ("PWM") noise shaper filter to thereby produce a first filter signal, where the noise includes a PWM quantization error signal, converting the first filter signal to a first analog signal using a first digital to analog converter, receiving at a second stage of the cascaded PWM noise shaper filter an inter-stage signal from the first stage and the PWM quantization error signal and producing therefrom a second filter signal, converting the second filter signal to a second analog signal using a second digital to analog converter, and combining the first and second analog signals to thereby produce the analog output signal.

In embodiments of the above-described method, the digital input signal is a pulse code modulation signal. In other embodiments, the digital input signal is a digital audio signal. In yet other embodiments, the first filter signal is a one-bit code signal. In further embodiments, the first predetermined band is within an audio signal sampling rate range.

While some embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

I claim:

1. A system for converting a digital signal to an analog signal, comprising:
   an interpolation filter including an input for receiving a digital input signal;
   a cascaded pulse width modulated noise shaper filter having a plurality of stages and having an input coupled to an output of the interpolation filter;
   a first digital to analog converter for receiving an input from a first of said plurality of stages of said noise shaper filter, said first digital to analog converter comprising a first finite impulse response filter having N-taps and N tap weights, wherein N is a predetermined number, and wherein each of said N-taps is implemented digitally and each of said N tap weights is implemented non-digitally using a first circuit;
   a second digital to analog converter for receiving an input from a second of said plurality of stages of said noise shaper filter, said second digital to analog converter comprising a second finite impulse response filter having N-taps and N tap weights, wherein N is a predetermined number, and wherein each of said N-taps is implemented digitally and each of said N tap weights is implemented non-digitally using a second circuit;
   a combining circuit for combining an output from said first and second digital to analog converters; and
   an output for outputting an analog signal from said combining circuit.

2. The system of claim 1 wherein at least one of said first and second circuit is a current steering circuit.

3. The system of claim 1 wherein at least one of said first and second circuit is a switched capacitor circuit.

4. The system of claim 1 wherein said digital input signal spans a first predetermined band, and wherein said interpolation filter up-samples said digital input signal by a predetermined value and outputs a first filter signal which spans a second predetermined band which includes said first predetermined band and is wider than said first predetermined band.

5. The system of claim 4 wherein said first noise shaper filter stage receives said first filter signal, suppresses conversion noise in said first predetermined band, and outputs a second filter signal to said first digital to analog converter, wherein said second filter signal spans said second predetermined band.

6. The system of claim 5 wherein said second noise shaper filter stage receives an input signal from said first noise shaper filter stage and an error signal and produces therefrom the input received by said second digital to analog converter.

7. The system of claim 6 wherein the input signal from said first noise shaper filter stage is scaled by a predetermined number K and the output from said second digital to analog converter is scaled by 1/K.

8. The system of claim 4 wherein said first predetermined band is within an audio signal sampling rate range.

9. The system of claim 4 wherein said predetermined value is in the range of 32-2048.

10. The system of claim 1 wherein said digital input signal is a pulse code modulation signal.

11. The system of claim 1 wherein said digital input signal is a digital audio signal.

12. A system for converting a digital signal to an analog signal, comprising:
   an interpolation filter comprising an input for receiving said digital signal and an output for outputting an interpolation signal, wherein said digital signal spans a first predetermined band, and wherein said interpolation signal spans a second predetermined band which is wider than said first predetermined band and includes said first predetermined band;
   a cascaded pulse width modulation ("PWM") noise shaper filter comprising:
      a first stage for receiving said interpolation signal and for receiving at least one error signal, wherein said first stage suppresses errors in said first predetermined band of said interpolation signal and outputs a PWM signal, wherein said PWM signal is a one-bit code signal, and wherein said at least one error signal includes a PWM quantization error signal; and
      a second stage for receiving an input signal from said first stage and receiving said PWM quantization error signal, and for outputting a second stage signal;
   a first digital to analog converter comprising:
      an input for receiving said PWM signal;
      a finite impulse response filter having N-taps and N tap weights for converting said PWM signal into a first converted signal wherein said first converted signal is a multi-level signal, wherein N is a predetermined number, and wherein each of said N-taps is implemented digitally and each of said N tap weights is implemented non-digitally using a first circuit; and
      a first output for outputting said first converted signal;
   a second digital to analog converter comprising:
      an input for receiving said second stage signal;
      a finite impulse response filter having N-taps and N tap weights for converting said second stage signal into a second converted signal wherein said second converted signal is a multi-level signal, wherein N is a predetermined number, and wherein each of said N-taps is implemented digitally and each of said N tap weights is implemented non-digitally using a second circuit; and
      a second output for outputting said second converted signal;
   a combining circuit for combining said first and second converted signals to produce therefrom a combined signal; and
   a reconstruction amplifier comprising:
      an input for receiving said combined signal;
      a third circuit for changing said combined signal into an analog signal; and
      an output for outputting said analog signal.

13. The system of claim 12 wherein said PWM quantization error signal received by said second stage is a time-delayed version of said PWM quantization error signal received by said first stage.

14. The system of claim 12 wherein at least one of said first and second circuits is a current steering circuit.

15. The system of claim 12 wherein at least one of said first and second circuits is a switched capacitor circuit.

16. The system of claim 12 wherein said digital input signal is a pulse code modulation signal.

17. The system of claim 12 wherein said digital input signal is a digital audio signal.

18. The system of claim 12 wherein said first predetermined band is in the range of 16-400 kHz.

19. The system of claim 12 wherein said third circuit includes an integrator which sums said combined signal and performs low pass filtering.

20. The system of claim 12 wherein the input signal received from said first stage is scaled by a predetermined number K and the said second converted signal is scaled by 1/K.

21. A method for converting a digital input signal to an analog output signal, the method comprising the steps of:
   receiving a digital input signal which spans a first predetermined band;
   up-sampling the digital input signal to produce an up-sampled signal which spans a second predetermined band which includes the first predetermined band and is wider than the first predetermined band;
   suppressing noise in the first predetermined band of the up-sampled signal using a first stage of a cascaded pulse width modulation ("PWM") noise shaper filter to thereby produce a first filter signal, wherein the noise includes a PWM quantization error signal;
   converting the first filter signal to a first analog signal using a first digital to analog converter;
   receiving at a second stage of said cascaded PWM noise shaper filter an inter-stage signal from said first stage and the PWM quantization error signal and producing therefrom a second filter signal;
   converting the second filter signal to a second analog signal using a second digital to analog converter; and
   combining the first and second analog signals to thereby produce the analog output signal.

22. The method of claim 21 wherein the digital input signal is a pulse code modulation signal.

23. The method of claim 21 wherein the digital input signal is a digital audio signal.

24. The method of claim 21 wherein the first filter signal is a one-bit code signal.

25. The method of claim 21 wherein the first predetermined band is within an audio signal sampling rate range.

26. A system for converting a digital signal to an analog signal, comprising:
- an interpolation filter including an input for receiving a digital input signal, wherein said digital input signal spans a first predetermined band, and wherein said interpolation filter up-samples said digital input signal by a predetermined value and outputs a first filter signal which spans a second predetermined band which includes said first predetermined band and is wider than said first predetermined band;
- a cascaded pulse width modulated noise shaper filter having a plurality of stages;
- a first digital to analog converter for receiving an input from a first of said plurality of stages of said noise shaper filter, said first digital to analog converter comprising a first finite impulse response filter having N-taps and N tap weights, wherein N is a predetermined number, wherein each of said N-taps is implemented digitally and each of said N tap weights is implemented non-digitally using a first circuit, wherein said first noise shaper filter stage receives said first filter signal, suppresses conversion noise in said first predetermined band, and outputs a second filter signal to said first digital to analog converter, and wherein said second filter signal spans said second predetermined band;
- a second digital to analog converter for receiving an input from a second of said plurality of stages of said noise shaper filter, said second digital to analog converter comprising a second finite impulse response filter having N-taps and N tap weights, wherein N is a predetermined number, wherein each of said N-taps is implemented digitally and each of said N tap weights is implemented non-digitally using a second circuit, and wherein said second noise shaper filter stage receives an input signal from said first noise shaper filter stage and an error signal and produces therefrom the input received by said second digital to analog converter;
- a combining circuit for combining an output from said first and second digital to analog converters; and
- an output for outputting an analog signal from said combining circuit.

* * * * *